(12) United States Patent
Ryu

(10) Patent No.: US 11,462,424 B2
(45) Date of Patent: Oct. 4, 2022

(54) HEATING DEVICE FOR HEATING OBJECT MATERIAL USING LASER BEAM AND INDIRECT HEATING METHOD USING LASER BEAM

(71) Applicant: RNR LAB INC., Seoul (KR)

(72) Inventor: Jeong Do Ryu, Seoul (KR)

(73) Assignee: RNR LAB INC., Seoul (KR)

(*) Notice: Subject to any disclaimer, the term of this patent is extended or adjusted under 35 U.S.C. 154(b) by 70 days.

(21) Appl. No.: 16/965,456

(22) PCT Filed: Jan. 30, 2018

(86) PCT No.: PCT/KR2018/001260
§ 371 (c)(1),
(2) Date: Jul. 28, 2020

(87) PCT Pub. No.: WO2019/151543
PCT Pub. Date: Aug. 8, 2019

(65) Prior Publication Data
US 2020/0357665 A1    Nov. 12, 2020

(51) Int. Cl.
| H01L 21/67 | (2006.01) |
| H01L 21/263 | (2006.01) |
| H01L 21/28 | (2006.01) |
| H01L 27/108 | (2006.01) |
| H01L 27/11556 | (2017.01) |

(52) U.S. Cl.
CPC .... *H01L 21/67115* (2013.01); *H01L 21/2636* (2013.01); *H01L 21/28176* (2013.01); *H01L 27/10861* (2013.01); *H01L 27/11556* (2013.01)

(58) Field of Classification Search
CPC ................ H01L 21/67115; H01L 21/26–2686
See application file for complete search history.

(56) References Cited

U.S. PATENT DOCUMENTS

| 11,117,214 B2* | 9/2021 | Choi | ..................... B29C 64/268 |
| 2017/0368570 A1* | 12/2017 | Ando | ..................... H01F 27/245 |
| 2019/0255650 A1* | 8/2019 | Chung | ..................... H01L 21/20 |

FOREIGN PATENT DOCUMENTS

| JP | 2018132638 A | * | 8/2018 | ......... G02B 26/0816 |
| KR | 1020060047214 A |  | 5/2006 |  |
| KR | 1020090029221 A |  | 3/2009 |  |
| KR | 1020120094151 A |  | 8/2012 |  |
| KR | 1020130081308 A |  | 7/2013 |  |
| KR | 1020130138686 A |  | 12/2013 |  |
| KR | 1020170000385 A |  | 1/2017 |  |

OTHER PUBLICATIONS

International Search Report of PCT/KR2018/001260, dated Oct. 30, 2018, English translation.

* cited by examiner

*Primary Examiner* — Jae Lee
(74) *Attorney, Agent, or Firm* — STIP Law Group, LLC

(57) ABSTRACT

The present invention is related to a heating device for heating an object material using a laser beam, the heating device comprising a stage on which the object material is placed; a laser module for generating and outputting a laser beam; an optical module for controlling a path of the laser beam; a polygon mirror rotating around an axis of rotation and having a plurality of reflecting surfaces which reflect the laser beam; and a beam guide module for controlling an incidence range within which the laser beam reflected by the polygon mirror is incident on the object material, and an indirect heating method using a laser beam in a heating device.

10 Claims, 7 Drawing Sheets preobjective system

HEATING DEVICE FOR HEATING OBJECT MATERIAL USING LASER BEAM AND INDIRECT HEATING METHOD USING LASER BEAM

CROSS-REFERENCE TO RELATED APPLICATIONS

This application is the U.S. National Phase under 35 U.S.C. § 371 of International Application No. PCT/KR2018/001260 filed on Jan. 30, 2018, the disclosures of which are incorporated by reference into the present application.

BACKGROUND OF THE INVENTION

1. Field

The present invention relates to a heating device for heating an object material using a laser beam and an indirect heating method using a laser beam.

2. Description of the Related Art

The object material may be heated by irradiating the object material with a laser. FIG. 1 is a diagram showing a conventional heating device for heating an object material using a laser beam, and FIG. 2 is a diagram showing a laser beam formed through a conventional heating device.

Referring to FIG. 1 and FIG. 2, a conventional heating device may include a laser module 100, an optic 110, a reflection mirror 120, and a stage 130 for placing the object material 140.

The laser output from the laser module 100 passes through the optic 110 and is formed into a rod-shaped beam 200. At this time, in the rod-shaped beam 200, the long direction is referred to as a beam length, and the short direction is referred to as a beam width.

On the other hand, when the object material 140 is exposed to the laser for a long time, the grain size for a specific phase of the object material 140 becomes large, and accordingly the resistance decreases, resulting in increasing a leakage current. Due to this characteristic, there is a problem that it is difficult to use for industrial use where there is a need to have a large resistance.

In this regard, the exposure time (Dwell Time) of the object material 140 is defined as in Equation 1 (Dwell Time Formula).

$$\text{Dwell Time (DT)} = BW/V_{Stage} \quad \text{(Equation 1)}$$

In connection with a method of heating an object material using a conventional heating device, there exist a method of reducing the beam width and a method of increasing the speed of the stage 130 to reduce the exposure time.

However, in general, it is difficult to control the minimum line width of the laser to 70 to 80 um or less, even if sophisticated optics are used, and it is also difficult to increase the speed of the stage 130 to a certain level or more. Due to the weight of the stage 130, there is a limit to increasing the speed by 0.5 m/s or more with the performance of a motor currently commercially available. If the actual take-off time is increased, it can be increased beyond that level, but it is also not easy to apply to the actual process since it increases the processing time for each scan.

For this reason, according to the conventional heating device, a minimum exposure time of 140 μs is derived as shown in Equation 2.

$$70 \text{ μm}/(0.5 \text{ m/s}) = 140 \text{ μs} \quad \text{(Equation 2)}$$

Therefore, a conventional heating device can be used only for an object material that requires a relatively large grain size due to an exposure time of 140 μs level. That is, when an object material requiring a relatively small grain size is heated by using a conventional heating device, there was a problem in that the grain size of the object material becomes large and leakage current is generated.

Related Prior Art Document: Patent Publication No. KR 10-2017-0000385

The present invention is devised to solve the above-mentioned problems, and thus provides a heating device and an indirect heating method which reduce exposure time, reduce grain size of an object material, and thus reduce leakage current, when heating the object material using a laser beam. However, the technological problems to be achieved by the present embodiment are not limited to the technological problems as described above, and other technological problems may exist.

SUMMARY OF THE INVENTION

According to one embodiment of the present invention, as a technological means for achieving the above-described technological problems, a heating device for heating an object material using a laser beam, the heating device comprising a stage on which the object material is placed; a laser module for generating and outputting a laser beam; an optical module for controlling a path of the laser beam; a polygon mirror rotating around an axis of rotation and having a plurality of reflecting surfaces which reflect the laser beam; a beam guide module for controlling an incidence range within which the laser beam reflected by the polygon mirror is incident on the object material may be provided.

Further, according to another embodiment of the present invention, an indirect heating method using a laser may be provided, the indirect heating method is performed in a heating device comprising a stage on which an object material is placed; a laser module for generating and outputting a laser beam; an optical module for controlling a path of the laser beam; a polygon mirror rotating around an axis of rotation and having a plurality of reflecting surfaces which reflect the laser beam; a beam guide module for controlling an incidence range within which the laser beam reflected by the polygon mirror is incident on the object material, the indirect heating method comprising arranging a first substance containing a metal and a second substance containing an inorganic substance adjacent to each other as the object material; and indirect heating the second substance adjacent to the first substance by irradiating the laser beam to the first substance to directly heat the first substance.

According to any one of the above-described means for solving the problems of the present invention, when heating an object material by using a laser beam, a heating device and an indirect heating method for reducing the grain size of the object material and thereby reducing the leakage current by reducing the exposure time may be provided.

DETAILED DESCRIPTION OF THE INVENTION

Figure 1:
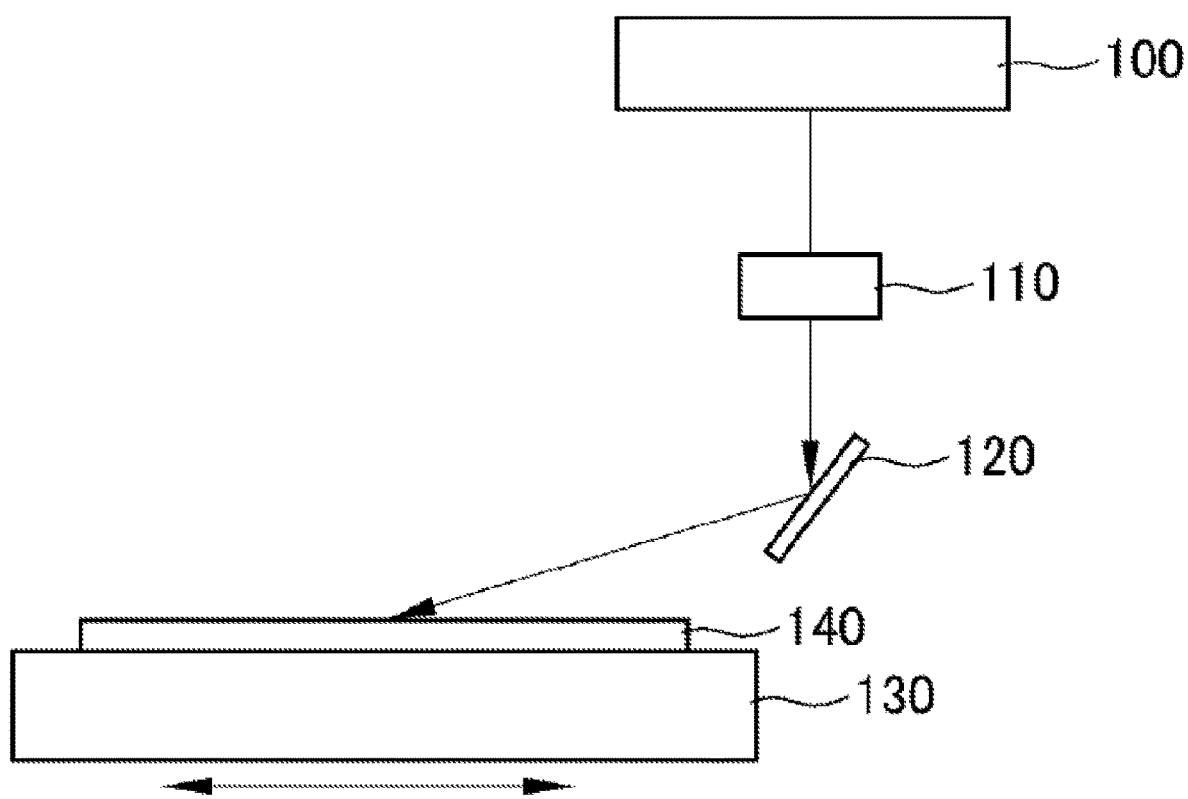
FIG. 1 is a diagram showing a conventional heating device for heating an object material using a laser beam.
Figure 2:
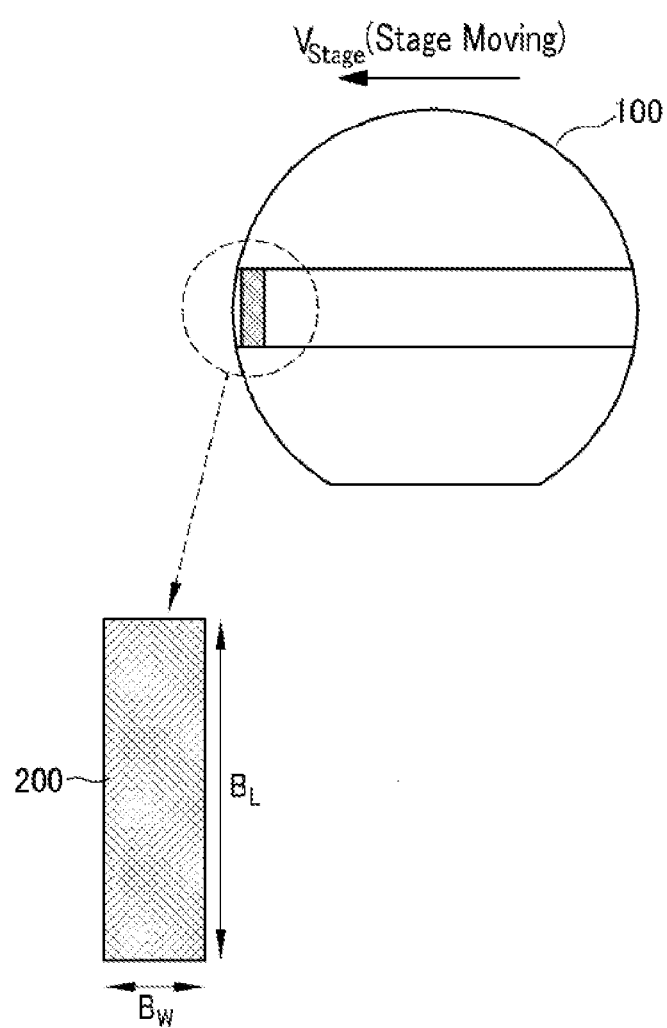
FIG. 2 is a diagram showing a laser beam formed through a conventional heating device.

Hereinafter, embodiments of the present invention will be described in detail with reference to the accompanying drawings so that those having a common knowledge in the related art to which the present invention pertains may easily implement the present invention. However, the present invention may be implemented in many different forms and is not limited to the embodiments described herein. In addition, in order to clearly describe the present invention via the drawings, the parts irrelevant to the description are omitted, and the similar reference numerals are assigned to the similar parts throughout the specification.

Throughout the specification, when it is mentioned that a part is "connected" to another part, this includes not only a "directly connected" case but also an "electrically connected" case while another element is arranged between them. Also, when a part is said to "include" a certain component, it means that the part does not exclude other components, but may further include other components, unless specifically stated otherwise. It should be understood that one or more other features or numbers, steps, operations, components, parts or existence of the combinations thereof, or possibility of addition is not excluded in advance In the present specification, the term, "unit" includes a unit realized by hardware, a unit realized by software, and a unit realized by using both. Further, one unit may be realized by using two or more hardware, and two or more units may be realized by one hardware.

Hereinafter, an embodiment of the present invention will be described in detail with reference to the accompanying drawings.

Figure 3:
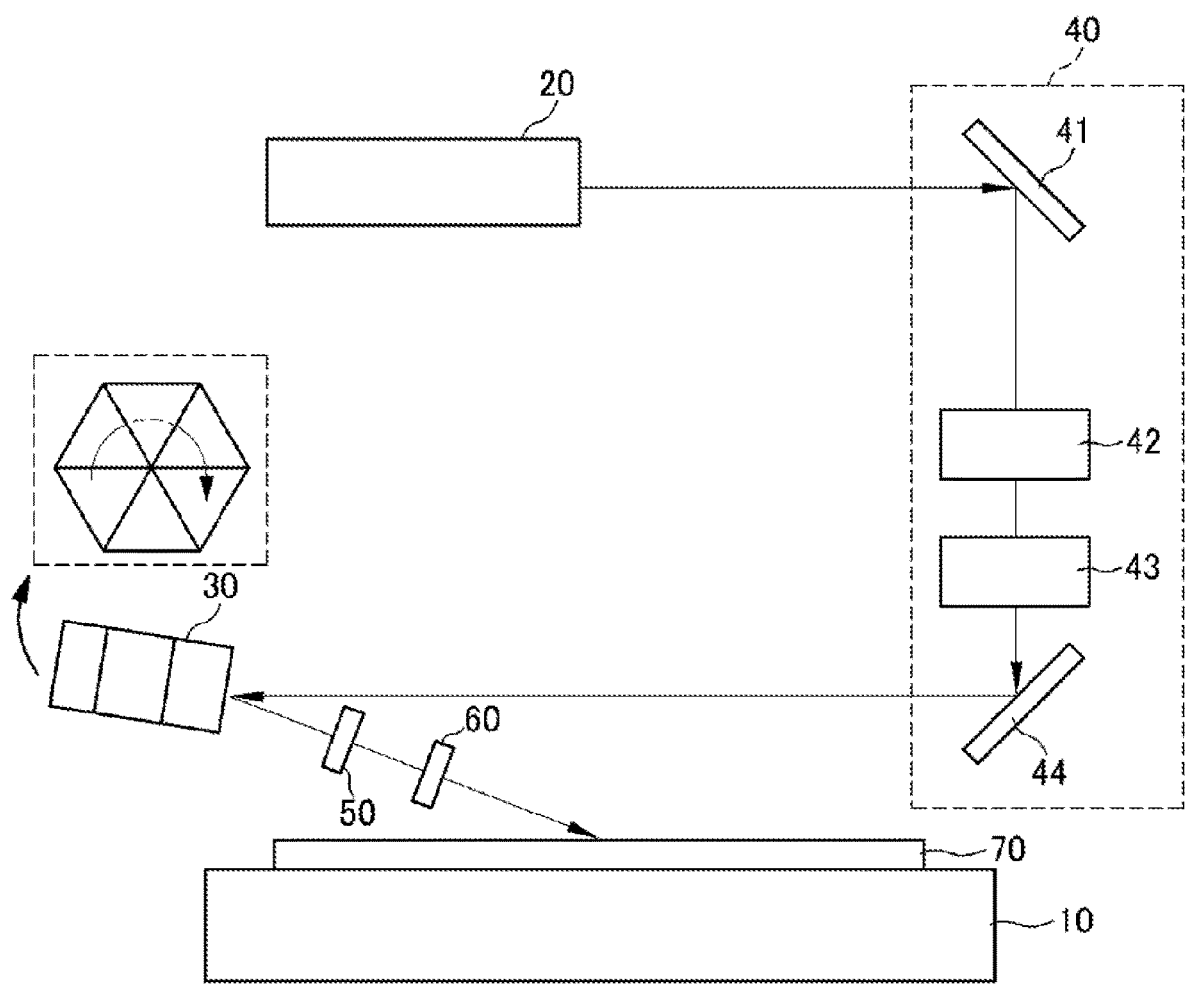
FIG. 3 is a diagram showing a heating device according to an embodiment of the present invention.

FIG. 3 is a diagram showing a heating device according to an embodiment of the present invention. Referring to FIG. 3, the heating device may include a stage 10, a laser module 20, a polygon mirror 30, an optical module 40, a beam guide module 50 and a projective system 60.

An object material 70 is placed on the stage 10. The object material 70 may include a first substance containing a metal and a second substance containing an inorganic substance disposed adjacent to the first substance.

The first substance may include, for example, any one of titanium (Ti), titanium nitride (TiN), titanium silicide (TiSi), tantalum (Ta), tantalum nitride (TaN), cobalt (Co), cobalt silicide (CoSi), nickel (Ni), nickel silicide (NiSi), ruthenium (Ru), tungsten (W), tungsten silicide (WSi), copper (Cu), rhenium (Re), molybdenum (Mo), niobium (Nb), chromium (Cr).

The second substance may include, for example, any one of hafnium oxide ($HfO_2$), hafnium silicon oxide ($HfSiO_4$), zirconium oxide ($ZrO_2$), zirconium silicon oxide ($ZrSiO_4$), lanthanum oxide ($La_2O_3$), lanthanum aluminate ($LaAlO_3$), aluminum oxide ($Al_2O_3$), tantalum oxide ($Ta_2O_5$), yttrium oxide ($Y_2O_3$), titanium dioxide ($TiO_2$), strontium titanium ($SrTiO_3$), ruthenium oxide ($RuO_2$), strontium ruthenate ($SrRuO_3$), titanium dioxide ($TiO_2$), barium titanate ($BaTiO_3$).

The stage 10 moves in at least one direction so that the entirety of the object material 70 may be scanned by a laser beam.

The laser module 20 generates and outputs a laser beam. The laser module 20 may include, for example, any one of a $CO_2$ laser, a YAG laser, a diode laser, and a fiber laser.

The laser beam may have a wavelength in the range of 1 μm to 11 μm, preferably, 10 μm to 11 μm, for example.

The laser beam can be irradiated to the first substance, for example. Accordingly, the second substance disposed adjacent to the first substance may be indirectly heated.

In general, the metal has a relatively large number of free electrons and may be heated to a very high temperature (for example, 1200 to 3000 degrees) by a laser. On the other hand, it is relatively difficult to heat a substance containing an inorganic substance (for example, $SiO_2$, Si, $Si_3N_4$) through a laser.

By using the above properties, the present invention may effectively heat the second substance by directly irradiating the laser beam to the first substance to indirectly heat the second substance, after disposing the first substance containing a metal and the second substance containing an inorganic substance adjacent to each other (for example, they are placed in contact with each other).

The polygon mirror 30 rotates around an axis of rotation and has a plurality of reflection surfaces that reflect a laser beam.

The polygon mirror 30 may control an incidence angle of a laser beam incident on the object material 70 based on the Brewster Angle of the object material 70. For example, the polygon mirror 30 may be controlled to an angle at which reflection generated at the interface between the first substance and the second substance is minimized according to a difference in the Brewster angle between the first substance and the second substance.

By controlling the incidence angle of a laser beam incident on the object material 70 freely, not only when using the Brewster angle applied to a film composed of a specific film material or a composite film of various film materials, but also in the conventional structure used in semiconductors, or a process wherein those structures are stacked in multiple arrangements, it is possible to provide a means to create an optimal process. For example, the method may be applied in various processes by setting the optimal angle of incidence even in a trench structure having a deep depth where the concept of the incidence angle must be applied differently from the Brewster angle.

For example, in the case of a capacitor of DRAM, which is an embodiment of the present invention, a capacitor node in the shape of a cylinder is formed of metal in several μm. At this time, the reference point of the Brewster angle of the incident wave is not the surface of Si, but should be the surface of the structure composed in several μm.

The same reason may be applied to a heat treatment of a channel of a vertical NAND flash or a high-k film (high-k) which is another embodiment.

Separately, for the original purpose of indirect heating by heating the metal, when the aspect ratio (A/R) is large in the applied process, the object is heated from its surface where the laser beam is reached first, and as it is getting farther and farther from the surface, the heating will be executed due to the thermal conduction of the metal film, rather than direct heating by the laser. In this way, heating by the thermal conduction may cause temperature unevenness between the upper and lower portions of the object material. In order to prevent this, in consideration of aspect ratio (A/R), it may be necessary to use an incidence angle in a range in which laser power can reach almost simultaneously from the top to the bottom of the structure. At this time, the incidence angle may be freely adjusted according to the purpose and results.

Due to the rotation of the polygon mirror 30, the laser beam may have a speed of several m/s to several hundred m/s (e.g., 2 m/s to 180 m/s). At this time, the exposure time (Dwell Time) may be defined through the beam width and the speed of the laser beam.

That is, in the case of substituting the speed of the laser beam instead of the speed of the stage in Equation 1 (assuming that the beam width is the same), an exposure time ranging from hundreds of ns to several μs (for example, 0.39 μs to 35 μs) (the speed of the laser beam is 2 m/s to 180 m/s) is derived.

As described above, according to the heating device of the present invention, it is possible to have an exposure time of at least 4 to 200 times less than the conventional heating device.

Therefore, the heating apparatus of the present invention may heat the object material 70 requiring a relatively small grain size, and may reduce leakage current generated as the grain size increases.

The optical module 40 controls a path of the laser beam generated by the laser module 20.

The optical module 40 may include, for example, a first mirror 41, a condenser lens 42, a beam shaper 43 and a second mirror 44.

The first mirror 41 reflects the laser beam generated by the laser module 20. The condenser lens 42 condenses the reflected laser beam reflected by the first mirror 41.

The beam shaper 43 transforms the shape of the laser beam condensed by the condensing lens 42 to a predetermined state. The beam shaper 43 may increase light efficiency by changing the shape of the beam.

The beam shaper 43 may be, for example, a fly-eye lens or a light pipe.

The second mirror 44 reflects the transformed laser beam such that the transformed laser beam may be directed to the polygon mirror 30.

Figure 4:
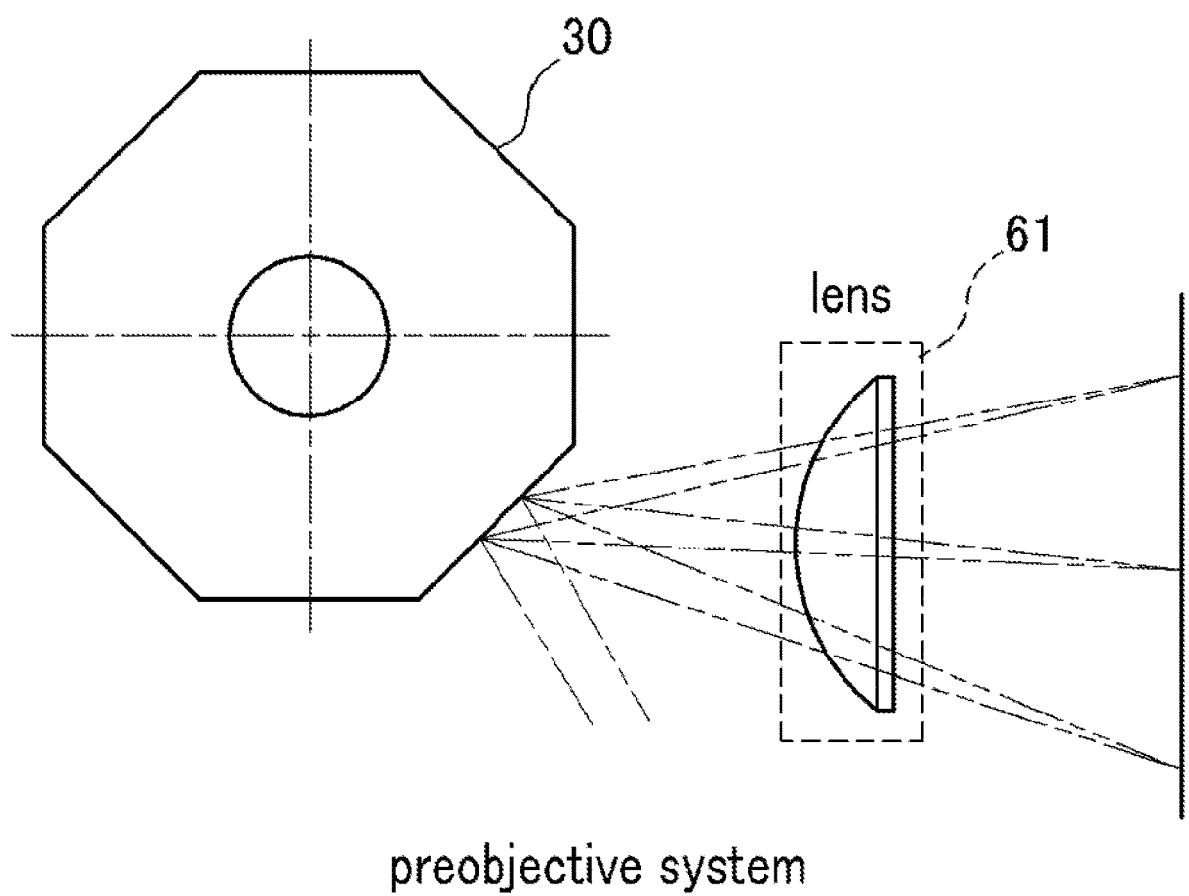
FIG. 4 is a diagram illustrating a projective system according to an embodiment of the present invention.

The projective system 60 is disposed between the polygon mirror 30 and the object material 70. The projective system 60 corrects the energy density of the laser beam reflected by the polygon mirror 30. The projective system 60 may optimize the uniformity of the laser beam according to the length of the trajectory of the laser beam. FIG. 4 shows an enlarged projective system 60.

Figure 5:
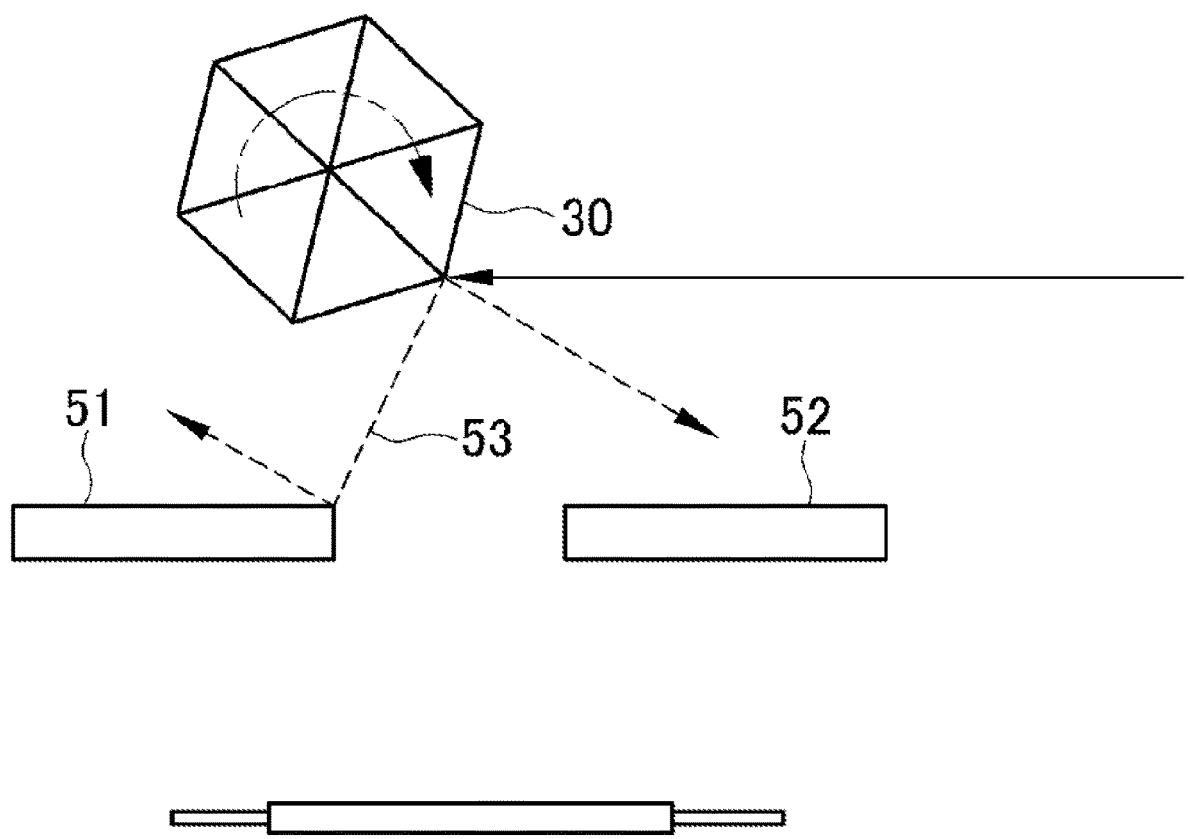
FIG. 5 is a diagram showing a beam guide module according to an embodiment of the present invention.

Referring to FIG. 5 together, the beam guide module 50 is disposed between the polygon mirror 30 and the object material 70 and may control the incidence range within which the laser beam is incident on the object material 70.

Figure 6:
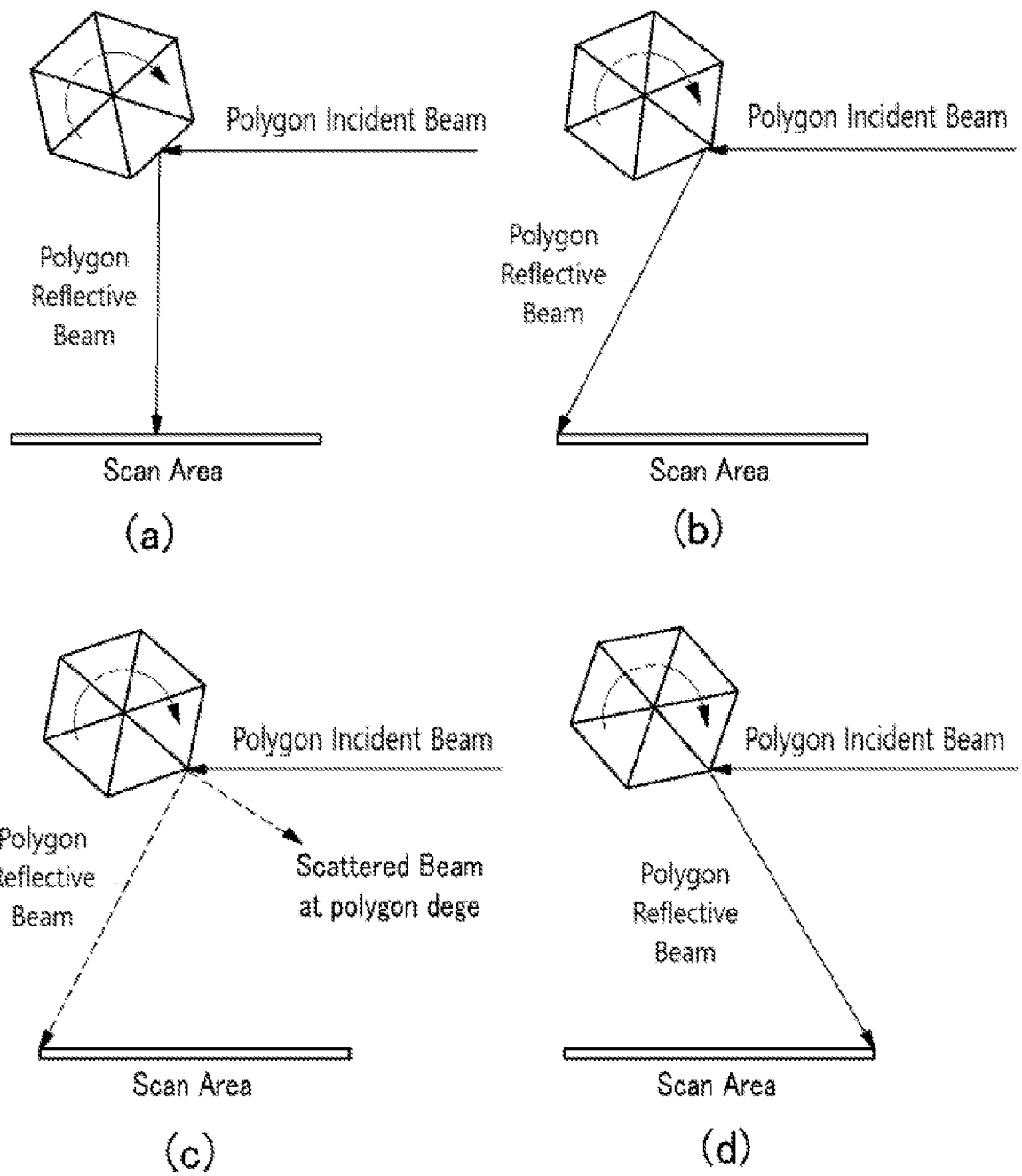
FIG. 6 (a), FIG. 6 (b), FIG. 6 (c) and FIG. 6 (d) are a diagram showing that a laser beam is scattered by an interface where two adjacent reflection surfaces among a plurality of reflection surfaces are contacted.

On the other hand, referring to FIG. 6, the laser beam is scattered by the interface where two adjacent reflecting surfaces among the plurality of reflecting surfaces of the polygon mirror are contacted, and the scattered laser beam reaches a specific position of the object material to change the object material.

Therefore, it is necessary to prevent the scattered laser beam from reaching the object material.

FIG. 6 shows a laser beam reflected on a plurality of reflection surfaces of the polygon mirror. Particularly, (c) of FIG. 6 shows that the laser beam scattered by the interface where two adjacent reflection surfaces among the plurality of reflection surfaces are contacted reaches a specific position of the object material.

Returning to FIG. 5 again, the beam guide module includes a plurality of beam dumps 51 and 52 which determine an incidence range of a laser beam, and are separated by a predetermined distance.

The plurality of beam dumps 51 and 52 block the laser beam 53 scattered by an interface where two adjacent reflection surfaces among the plurality of reflection surfaces meet.

Accordingly, it is possible to prevent the laser beam scattered by the interface, where two adjacent reflecting surfaces among the plurality of reflecting surfaces are contacted, from reaching a specific position of the object material.

The heating device of the present invention may be used in a process of heating a channel film of a vertical NAND structure.

For example, a vertical NAND structure may be formed by a step for forming a channel film made of a second substance as the second substance structure on an insulating film in a trench after forming the insulating film in the trench implemented in a device structure; and a step for forming a core portion made of a first substance filling the remaining empty space in the trench as the first substance structure, and a laser receiving pad made of a first substance to be connected to the core portion on the upper surface of the device structure after forming the channel film. At this time, reaction or interdiffusion between the first substance and the second substance may occur due to high-temperature heating, and one or more third substances capable of preventing this phenomenon may be included between the first substance and the second substance. This is because if the reaction or the interdiffusion occurs, the removal of the first substance may not be easy in the subsequent step of removing the first substance. The third substance may include, for example, any one of $SiO_2$ film, $Si_3N_4$, polysilicon, and amorphous silicon.

Here, the second substance may be heated or melted by irradiating the laser on the laser receiving pad in order to lower the resistance of the channel film.

The device structure may include a vertical NAND (VNAND) structure, and the second substance may include polysilicon. The insulating film may be composed of a trap layer made of silicon nitride, a blocking oxide layer made of aluminum oxide, and an HQ oxide layer made of silicon oxide.

Through conventional lasers, there is a limitation in heating or melting the entire polysilicon (4 to 5 micrometer depth), which is a channel layer of a vertical NAND (VNAND) structure. However, after performing a gap-fill or a macaroni fill with the first substance, annealing is performed using a $CO_2$ laser, a YAG laser, a diode laser, and a fiber laser so that a current of a channel may be increased by lowering a resistance of the channel by heating the first substance and heating or melting the channel layer made of polysilicon which is the second substance in contact with the first substance. Thereafter, the provided gap-fill or macaroni fill of the first substance is removed by a suitable method. It is a very important process to increase the current by reducing the resistance of the channel film as the number of stacks of the vertical NAND (VNAND) structure increases. In the present embodiment, after forming the above-described first substance structure around the channel film, it may be implemented through an annealing step using a $CO_2$ laser, a YAG laser, a diode laser, and a fiber laser.

On the other hand, it is not easy to directly irradiate a $CO_2$ laser, YAG laser, a diode laser, and a fiber laser to a core portion having a narrow cross-sectional area to indirectly heat the channel film. Therefore, it is effective to form a laser receiving pad having a relatively wide cross-section while being connected to the core portion and then, to irradiate a $CO_2$ laser, a YAG laser, a diode laser, and a fiber laser to the laser receiving pad.

In addition, the heating device of the present invention may be used in a process of indirectly heating a dielectric film by heating an upper electrode of a DRAM capacitor structure including the dielectric film made of a second substance and the upper electrode made of a first sub stance.

For example, the DRAM capacitor structure may be formed by a step for forming a lower electrode in a trench implemented in a device structure, a step for forming a dielectric film made of a second substance as the second substance structure on the lower electrode in the trench; and a step for forming an upper electrode made of a first substance on the dielectric film in the trench as the first substance structure, and a laser receiving pad consisting of a first substance to be connected to the upper electrode on the upper surface of the device structure.

Here, in order to increase the dielectric constant of the dielectric film, the second substance may be heated or melted by irradiating the laser on the laser receiving pad.

The device structure may include a capacitor structure of a DRAM, and the first substance may include titanium nitride (TiN) or ruthenium (Ru), and the second substance may include any one of $HfO_2$, $HfSiO_4$, $ZrO_2$, $ZrSiO_4$, $La_2O_3$, $LaAlO_3$, $Al_2O_3$, $Ta_2O_5$, $Y_2O_3$, $TiO_2$, $SrTiO_3$. In this case, the dielectric film is sequentially phase-transformed into an amorphous structure, a monoclinic structure, a tetragonal structure, and a cubic structure, whereby a dielectric film having a sufficiently high dielectric constant may be implemented. That is, in connection with any one of $HfO_2$, $HfSiO_4$, $ZrO_2$, $ZrSiO_4$, $La_2O_3$, $LaAlO_3$, $Al_2O_3$, $Ta_2O_5$, $Y_2O_3$, $TiO_2$, $SrTiO_3$, of which phase changes at relatively high temperatures, a higher dielectric property may be realized by obtaining a tetragonal phase, an orthoromic phase, or a cubic phase in which high permittivity is guaranteed by using $CO_2$ laser, YAG laser, diode laser, fiber laser.

In addition, the heating device of the present invention may be used in the process of indirectly heating polysilicon by heating a metal in a transistor structure of a memory device including the metal and polysilicon.

For example, a transistor structure of a memory device may be formed by a step for forming a gate oxide layer; a step for forming a polysilicon film as the second substance structure on the gate oxide film; a step for firstly forming a titanium nitride (TiN) film, a tungsten nitride (WN) film, a silicon tungsten (WSi) film, or a tantalum nitride (TaN) film on the polysilicon film as the first substance structure, and forming a tungsten (W) film sequentially. At this time, reaction or interdiffusion between the first substance and the second substance due to high-temperature heating may occur, and one or more third substances capable of preventing this may be included between the first substance and the second substance. This is because if the reaction or the interdiffusion occurs, the removal of the first substance may not be easy in the subsequent step of removing the first substance. The third substance may include, for example, one of an $SiO_2$ film, $Si_3N_4$, polysilicon, and amorphous silicon.

Here, at least a part of the polysilicon film may be heated or melted by irradiating the laser on the tungsten film to lower the equivalent oxide film thickness (EOT) of the transistor.

That is, the transistor structure of DRAM (or FLASH) is made of Gate oxide/Polysilicon/Metal (TiN/W). At this time, since the heating of the metal is easily performed, it induces local heating or melting of the polysilicon in contact with the metal, thereby strengthening the activation of B or P, reducing polysilicon depletion and reducing EOT. That is, in connection with a polysilicon depletion at the metal gate, an activation to remove the polysilicon depletion may be performed via a metal assisted heating process for a short time at a high temperature.

In addition, the heating apparatus of the present invention may be used in a process for heating indirectly a second substance by directly heating a first substance in a transistor structure of a logic element including TiN (or TaN)/W as the first substance and the High-k substance as the second substance.

For example, the transistor structure of the logic element may be formed according to a step for forming an amorphous polysilicon film as the second substance structure; and a step for forming the first substance structure on the amorphous polysilicon film.

Here, the resistance of the second substance structure may be lowered by irradiating the laser on the first substance structure to heat or melt at least a portion of the amorphous polysilicon film.

Among the methods of lowering the resistance of polysilicon (or amorphous silicon), the poly melt method is a general method to easily increase the grain size. By connecting polysilicon (or amorphous silicon) and metal, and using $CO_2$ laser, YAG laser, diode laser, and fiber laser, melting of polysilicon (or amorphous silicon) by heating of metal may be realized.

In addition, the heating device of the present invention, may prevent interdiffusion between an exposed portion to a light source and an unexposed portion of a photoresist by coating a metal film under the photoresist during a photolithography process, when performing the bake after coating or bake after exposure. Therefore, LER (Line Edge Roughness) or WER (Width Edge Roughness) may be adjusted to be improved. At this time, reaction or interdiffusion between the photoresist and the metal film due to high-temperature heating may occur, in this regard, one or more third substances capable of preventing this occurrence may be included between the first substance and the second substance. This is because, if reaction or interdiffusion occurs, the removal of the photoresist may not be easy in the subsequent step of removing the photoresist. The third substance may include, for example, any one of an $SiO_2$ film, $Si_3N_4$, polysilicon, and amorphous silicon.

Besides this, the heating device of the present invention may be applied in various processes.

Figure 7:
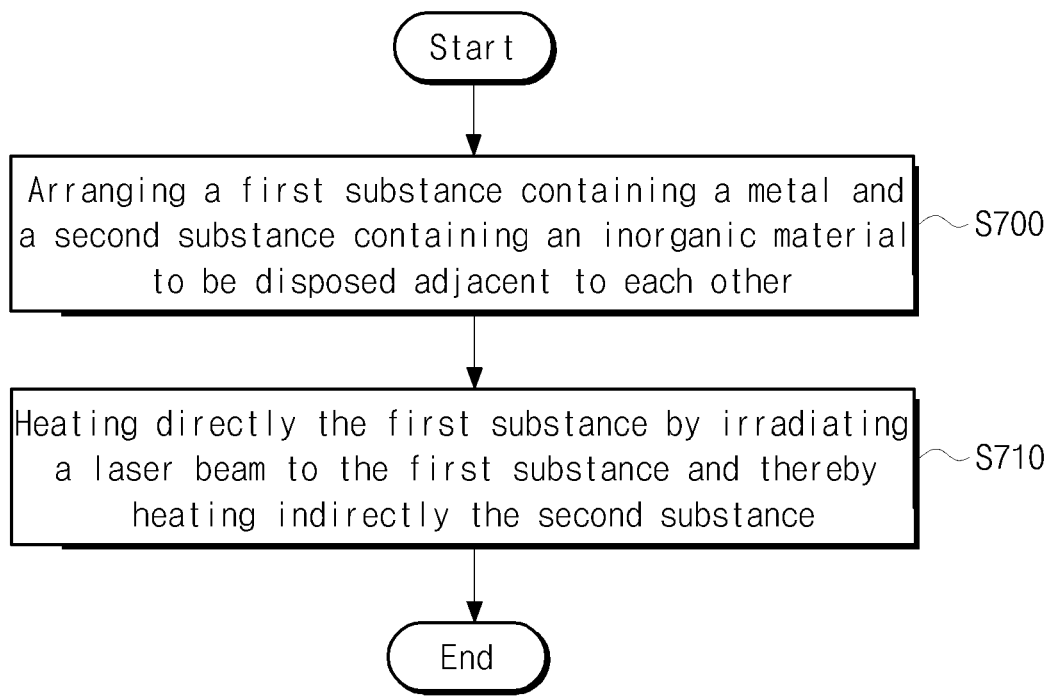
FIG. 7 is a flowchart illustrating an indirect heating method using a laser according to an embodiment of the present invention.

FIG. 7 is a flowchart illustrating an indirect heating method using a laser according to an embodiment of the present invention.

Referring to FIG. 7, in step S700, a first substance containing a metal and a second substance containing an inorganic substance may be disposed adjacent to each other as an object material. At this time, reaction or interdiffusion between the first substance and the second substance due to high-temperature heating may occur, in this regard, one or more third substances capable of preventing this occurrence may be included between the first substance and the second substance. The third substance may include, for example, any one of $SiO_2$ film, $Si_3N_4$, polysilicon, and amorphous silicon.

In step S710, the second substance adjacent to the first substance may be indirectly heated by irradiating the first substance with the laser beam to directly heat the first substance.

Although not shown, the indirect heating method using a laser according to an embodiment of the present invention may further include a step for controlling an incident angle incident on the object material based on a Brewster Angle of the object material.

The above description of the present invention is for illustration only, and those skilled in the art to which the present invention pertains can understand that it can be easily modified to other specific forms without changing the technological spirit or essential features of the present invention. Therefore, it should be understood that the embodiments described above are illustrative in all respects and the embodiments are not the limited examples. For example, each component described as a single type may be implemented in a distributed manner, and similarly, the components described as distributed may be implemented in a combined form.

The scope of the present invention is indicated by the following claims rather than the above detailed description, and it should be interpreted that all changes or modified forms derived from the meaning and scope of the claims and equivalent concepts thereof are included in the scope of the present invention.

What is claimed is:

1. A heating device for heating an object material using a laser beam, the heating device comprising:
   a stage on which the object material is placed;
   a laser module for generating and outputting a laser beam;
   an optical module for controlling a path of the laser beam;
   a polygon mirror rotating around an axis of rotation and having a plurality of reflecting surfaces which reflect the laser beam; and
   a beam guide module for controlling an incidence range within which the laser beam reflected by the polygon mirror is incident on the object material,
   wherein,
   the beam guide module is disposed between the polygon mirror and the object material, and
   the beam guide module comprises a plurality of beam dumps which are separated by a predetermined distance and determine the incidence range, and block a laser beam scattered by an interface where two adjacent reflection surfaces among the plurality of reflecting surfaces are contacted.

2. The heating device of the claim 1, wherein the optical module comprises a first mirror reflecting the laser beam generated by the laser module; a condensing lens condensing the reflected laser beam reflected by the first mirror; a beam shaper that transforms the shape of the condensed laser beam into a predetermined state; and a second mirror reflecting the transformed laser beam such that the transformed laser beam is directed to the polygon mirror.

3. The heating device of the claim 1, further comprising a projective system for correcting the energy density of the laser beam reflected by the polygon mirror.

4. The heating device of the claim 1, wherein the object material comprises a first substance containing a metal; and a second substance containing an inorganic substance and disposed adjacent to the first substance, and the laser beam is irradiated to the first substance to directly heat the first substance and thus, the second substance adjacent to the first substance is indirectly heated.

5. The heating device of the claim 4, wherein the object material further comprises one or more third substances disposed between the first substance and the second sub stance.

6. The heating device of the claim 1, wherein the laser module is any one of a $CO_2$ laser, a YAG laser, a diode laser, and a fiber laser.

7. The heating device of the claim 1, wherein the laser beam has a wavelength of 1 µm to 11 µm.

8. The heating device of the claim 1, wherein the laser beam reflected on the plurality of reflection surfaces has a speed of 2 m/s to 180 m/s.

9. The heating device of the claim 1, wherein an exposure time of the object material to the laser beam is 0.39 µs to 35 µs.

10. The heating device of the claim 1, wherein the polygon mirror controls an incident angle of a laser beam incident on the object material based on the Brewster Angle of the object material.

\* \* \* \* \*